United States Patent [19]
Deen et al.

[11] Patent Number: 5,764,106
[45] Date of Patent: Jun. 9, 1998

[54] GAIN-CONTROLLED AMPLIFIER AND AUTOMATIC GAIN CONTROL AMPLIFIER USING GCLBT

[75] Inventors: M. Jamal Deen, Coquitlam; Zhixin Yan, Vancouver; Duljit S. Malhi, Kanata, all of Canada

[73] Assignee: Northern Telecom Limited, Montreal, Canada

[21] Appl. No.: 609,751

[22] Filed: Feb. 29, 1996

Related U.S. Application Data

[63] Continuation-in-part of Ser. No. 310,003, Sep. 20, 1994, which is a continuation-in-part of Ser. No. 163,636, Dec. 9, 1993, abandoned.

[51] Int. Cl.[6] .................. H03G 3/30; H03F 3/16
[52] U.S. Cl. ............... 330/279; 330/300; 330/285
[58] Field of Search ................... 330/279, 285, 330/299, 300, 307, 278

[56] References Cited

U.S. PATENT DOCUMENTS

| | | | |
|---|---|---|---|
| 4,334,196 | 6/1982 | Schade, Jr. ................ | 330/253 |
| 5,331,290 | 7/1994 | Harford et al. ............. | 330/254 |
| 5,467,057 | 11/1995 | Joardar ...................... | 330/307 X |
| 5,498,885 | 3/1996 | Deen et al. ................. | 330/300 X |

*Primary Examiner*—Steven Mottola
*Attorney, Agent, or Firm*—Angela C. de Wilton

[57] ABSTRACT

A gain-controlled amplifier for an integrated circuit includes a PNP gate controlled lateral bipolar transistor (GCLBT) which is configured in a common base configuration. The emitter electrode of the GCLBT is connected to a Bias-T having an inductor and a capacitor. The collector electrode of the GCLBT is coupled to a load capacitor, the capacitance of which is selected to alter the bandwidth of the amplifier. A gain control voltage is applied to the gate electrode of the GCLBT to control the amplifier gain. An input signal to be amplified is coupled to the emitter electrode of the GCLBT. An output signal, which is amplified in response to the gain control voltage, is provided from the collector electrode of the GCLBT. The gain-controlled amplifier can be used for an automatic gain control amplifier and also may be used for radio frequency and intermediate frequency amplifiers.

12 Claims, 16 Drawing Sheets

GAIN-CONTROLLED AMPLIFIER AND AUTOMATIC GAIN CONTROL AMPLIFIER USING GCLBT

CROSS REFERENCE

This is a continuation-in-part application of U.S. patent application Ser. No. 08/310,003 entitled "Gate Controlled Lateral Bipolar Junction Transistor and Method of Fabrication thereof" filed by D. S. Malhi et al on 20 Sep. 1994, which is a continuation-in-part of U.S. patent application Ser. No. 08/163,636 entitled "Semiconductor Device for an Integrated Circuit" filed by D. S. Malhi et al on 9 Dec. 1993, now abandoned.

TECHNICAL FIELD

The present invention relates to a gain-controlled amplifier and an automatic gain control amplifier using a gate controlled lateral bipolar transistor.

BACKGROUND ART

Gain-controlled amplifiers, which allow the amplifier gain to be controlled by an automatic gain control (AGC) loop, are used in various electric circuits, such as radio frequency and intermediate frequency amplifiers. A simple conventional gain-controlled amplifier for a bipolar integrated circuit is, for example, of an emitter coupled differential amplifier. A known conventional prior art wideband gain-controlled amplifier uses differential current partitioning. The conventional gain-controlled amplifier for bipolar integrated circuits typically comprises three to six bipolar transistors. In order for AGC amplifiers to improve their signal handling capability and dynamic range, it is necessary to improve their gain controllability.

U.S. Pat. No. 5,331,290 granted to J. R. Harford et al on Jul. 19, 1994 discloses a gain-controlled amplifier having differential bipolar transistor pairs. The disclosed amplifier may be used for an AGC amplifier with tracking AGC. The gain-controlled amplifier comprises a plurality of bipolar transistors.

U.S. Pat. No. 4,334,196 granted to O. H. Schade Jr. on Jan. 8, 1982 discloses a CMOS (complementary metal oxide semiconductor) type integrated circuit amplifier using a combination of vertical and lateral bipolar transistors with field effect transistor structures. The amplifier also comprises a plurality of bipolar transistors.

SUMMARY OF THE INVENTION

It is an object of the present invention to provide an improved gain-controlled amplifier and an improved automatic gain control amplifier for an integrated circuit.

According to one aspect of the present invention, there is provided a gain-controlled amplifier comprising a gate controlled lateral bipolar transistor (GCLBT) having emitter, collector, base and gate electrodes, the GCLBT being provided in a common base configuration. The gain-controlled amplifier further comprises: means for providing a first voltage to the base electrode; means for providing a second voltage to the collector electrode via a load circuit having a frequency response control element; means for applying an input signal to the emitter electrode; and means for providing a gain control voltage to the gate electrode, thereby providing an amplified signal of the input signal from the collector electrode in response to the gain control voltage.

In the gain-controlled amplifier, an output signal which is an amplified signal of the input signal is provided from the collector electrode, in response to the gain control voltage. Upon variance at the gain control voltage, the gain of the GCLBT is variably controlled and the voltage of the output signal is variably amplified.

In an example, the load circuit includes resistance and capacitance elements. The resistance element is connected between the collector electrode of the GCLBT and a terminal to which the second voltage is supplied. The capacitance element is connected between the collector and the base electrodes of the GCLBT. The resistance and capacitance are selected to alter the frequency response of the gain-controlled amplifier.

In another example, the gain-controlled amplifier further comprises an input dc bias network having an inductance element and a capacitance element. The network is connected to the emitter electrode of the GCLBT. The inductance and capacitance are selected to provide an adequate low frequency response of the gain-controlled amplifier. The GCLBT is a PNP type transistor.

According to another aspect of the present invention, there is provided an automatic gain control amplifier for an integrated circuit, comprising a gate controlled lateral bipolar transistor (GCLBT) having emitter, collector, base and gate electrodes, the GCLBT being provided in a common base configuration. The automatic gain control amplifier further comprises: means for providing a first voltage to the base electrode; means for providing a second voltage to the collector electrode via a load circuit having a frequency response control element; means for applying an input signal to the emitter electrode, thereby providing an output signal from the collector electrode in response to the input signal; and gain control means for providing a gain control voltage to the gate electrode in response to the output signal from the collector electrode. The input signal is amplified in response to the gain control voltage, the amplified signal being the output signal provided from the collector electrode of the GCLBT.

In an example, the gain control voltage is constant when the amplified output signal voltage is smaller than a reference voltage, so that the gain of the amplifier is constant. The gain control voltage is at variance when the amplified output signal voltage is larger than the reference voltage, so that the gain of the amplifier is variably lessened in response to the amplified output signal voltage.

BRIEF DESCRIPTION OF THE DRAWINGS

The present invention will be further understood from the following description with reference to the accompanying drawings, in which.

DETAILED DESCRIPTION

I. Prior Art Gain-Controlled Amplifiers

Figure 1:
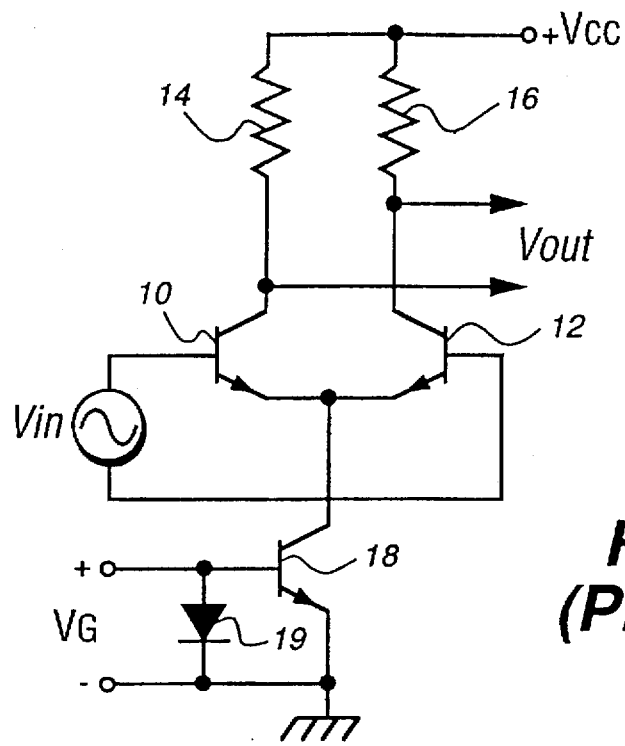
FIG. 1 is a circuit diagram of a prior art gain-controlled amplifier.

FIG. 1 shows a conventional gain-controlled amplifier based on an emitter coupled differential amplifier. In FIG. 1, an input signal of voltage $vi_n$ to be amplified is fed to the base electrodes of two bipolar transistors 10 and 12, the collectors of which are connected via load resistors 14 and 16, respectively, to a voltage supply terminal of $+V_{CC}$. Both emitter electrodes of the transistors 10 and 12 are connected to the collector electrode of a bipolar transistor 18, the emitter electrode of which is connected to the ground terminal. Included is a diode 19, the anode and cathode of which are connected to the base and emitter electrodes of the transistor 18, respectively. The transistor 18 operates as a current source of the emitter coupled transistors 10 and 12. The gain of the differential amplifier is controlled by a gain control circuit (not shown) which provides a gain control voltage $V_G$ to the base electrode of the transistor 18. An amplified output signal of voltage $v_{out}$, which is a differential voltage, is provided from the collector electrodes of the transistors 10 and 12. The gain-controlled amplifier needs three bipolar transistors in an integrated circuit.

Figure 2:
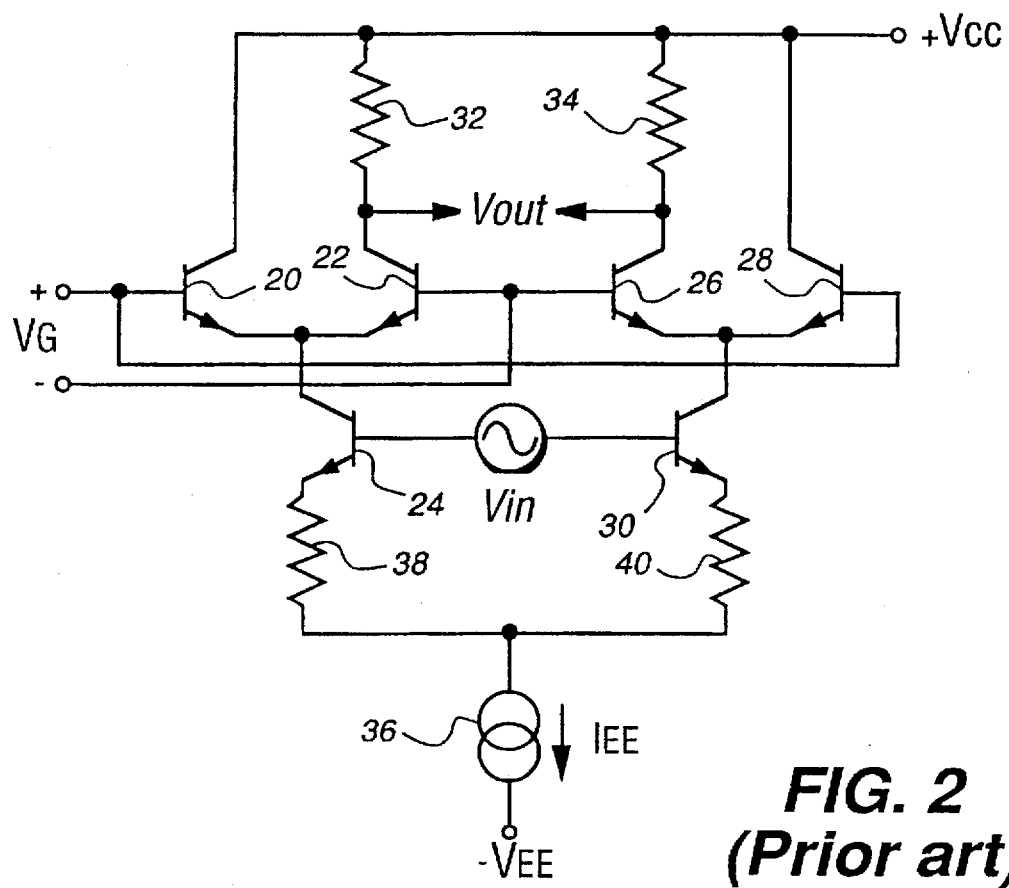
FIG. 2 is a circuit diagram of another prior art gain-controlled amplifier.

FIG. 2 shows a wideband gain-controlled amplifier including two pairs of emitter coupled bipolar transistors. In FIG. 2, the emitter electrodes of bipolar transistors 20 and 22 are connected to the collector electrode of a bipolar transistor 24 and the emitter electrodes of bipolar transistors 26 and 28 are connected to the collector of a bipolar transistor 30. The collector electrodes of the transistors 22 and 26 are connected to a voltage supply terminal of $+V_{CC}$ via load resistors 32 and 34, respectively. The collector electrodes of the transistors 20 and 28 are directly connected to the voltage supply terminal. The emitter electrodes of the transistors 24 and 30 are connected to a current source circuit 36 via resistors 38 and 40, respectively. The gain of the amplifier is controlled by a gain control voltage $V_G$ which is applied by a gain control circuit (not shown) between the base electrodes of the transistors 20, 22 and between the transistors 28, 26. An input signal of voltage $vi_n$ to be amplified is applied between the base electrodes of the transistors 24 and 30. An amplified output signal of voltage $V_{out}$ is provided from the collector electrodes of the transistors 22 and 26. The gain-controlled amplifier needs six bipolar transistors in an integrated circuit.

II. Embodiment Gain-Controlled Amplifier

Figure 3:
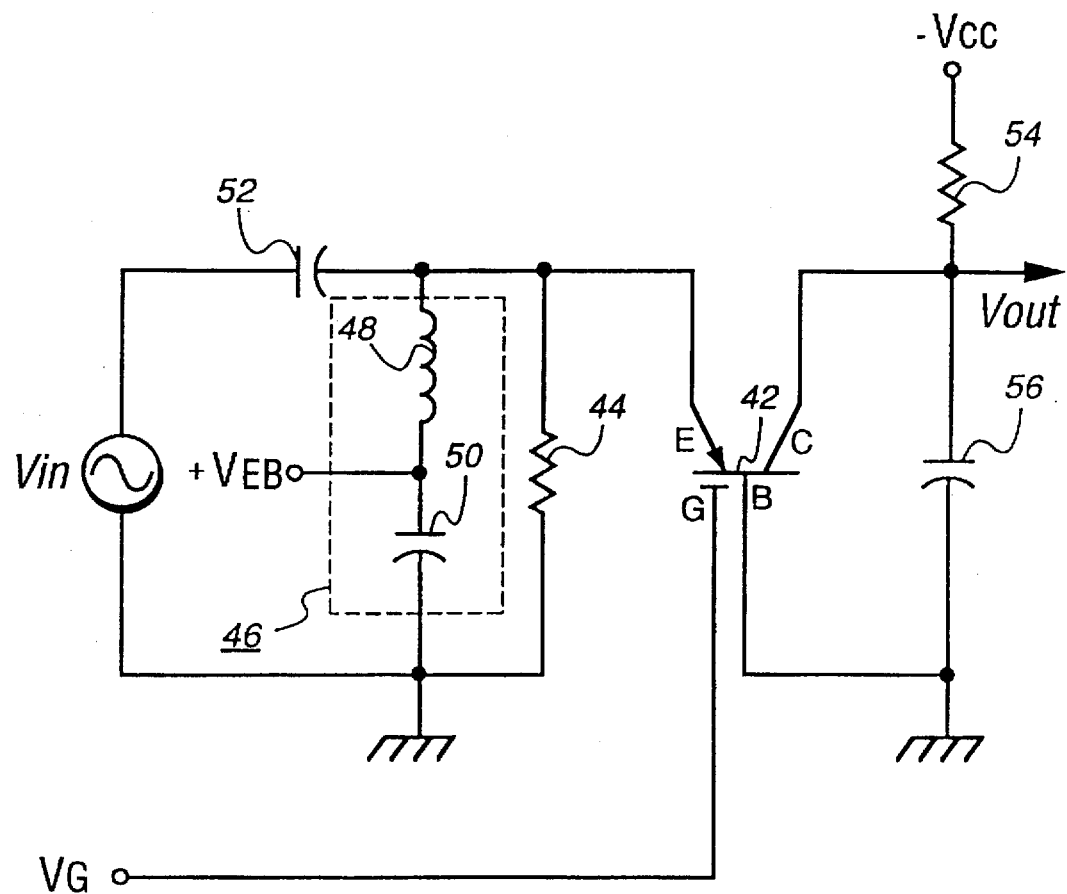
FIG. 3 is a circuit diagram of a gain-controlled amplifier having a gate control lateral bipolar transistor (GCLBT) according to an embodiment of the present invention.

FIG. 3 shows an embodiment gain-controlled amplifier including a gate controlled lateral bipolar transistor (GCLBT). In FIG. 3, the base electrode B of a GCLBT 42 is connected to the ground terminal (of zero volts). An impedance matching resistor 44 and a Bias-T 46 are connected in parallel between the emitter electrode E of the GCLBT 42 and the ground terminal. The Bias-T 46 has series-connected inductor 48 and capacitor 50 and a dc bias circuit. A positive bias voltage $+V_{EB}$ is fed to the junction of the inductor 48 and the capacitor 50. An input signal of voltage $vi_n$ to be amplified is fed to the emitter electrode E of the GCLBT 42 via a decoupling capacitor 52. A gain control circuit (not shown) provides a gain control voltage $V_G$ to the gate electrode G of the GCLBT 42. The collector electrode C of the GCLBT 42 is connected to a negative voltage supply terminal of $-V_{CC}$ via a load resistor 54 and to the ground terminal via a load capacitor 56.

The inductance of the inductor 48 and the capacitance of the capacitor 50 of the Bias-T 46 are selected to provide an adequate low frequency response of the gain-controlled amplifier. In response to the gain control voltage $V_G$, the input signal voltage $vi_n$ is amplified and an amplified output signal of voltage $v_{out}$ is provided from the collector electrode C of the GCLBT 42.

Figure 4:
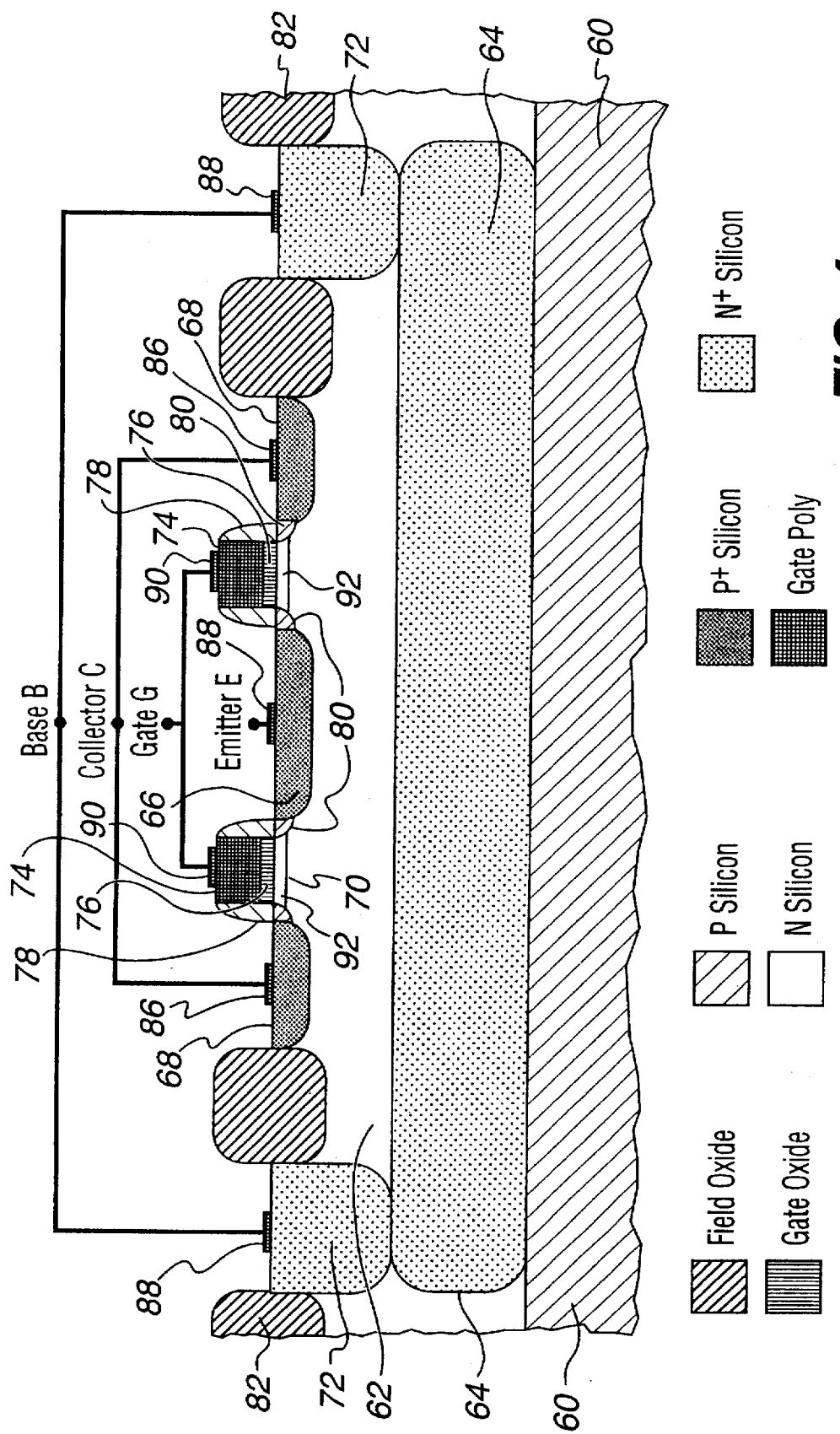
FIG. 4 is a cross sectional view of a GCLBT for use in a gain-controlled amplifier shown in FIG. 3.

Examples of values of the components are:
Resistance R44 of the resistor 44: 50Ω
Inductance L48 of the inductor 48: 10 μH
Capacitance C50 of the capacitor 50: 10 μF
Capacitance C52 of the capacitor 52: 100 nF
Resistance R54 of the resistor 54: 4 kΩ
Capacitance C56 of the capacitor 56: 5 pF FIG. 4 shows a GCLBT for use in a gain-controlled amplifier shown in FIG. 3. The GCLBT takes the form of a merged PMOS and lateral bipolar junction transistor, having five electrodes (i.e., an emitter electrode E, a collector electrode C, a base electrode B, a gate electrode G and a substrate).

The GCLBT may be configured as a four electrode semiconductor device for implementation as an amplifier circuit, i.e., in a grounded base configuration as shown in FIG. 3. The structure of the GCLBT and its fabrication are described in detail in a copending U.S. patent application Ser. No. 08/310,003 entitled "Gate Controlled Lateral Bipolar Junction Transistor and Method of Fabrication thereof" filed by D. S. Malhi et al on 20 Sep. 1994, which is incorporated herein by reference. The GCLBT is compatible with bipolar CMOS process technology.

In FIG. 4, the GCLBT is formed on a silicon substrate 60 of a P conductive type and includes a lightly doped epitaxial layer 62 of a P conductivity type, with an underlying heavily doped buried layer 64 of an N conductivity type. A first heavily doped region 66 forms an emitter and laterally spaced apart, heavily doped regions 68 of an N conductivity type comprise parts of an annular collector. Part of the semiconductor layer extending between the emitter and collector forms an active base region 70 of the GCLBT. A base contact (i.e., a sinker 72) is provided to part of the buried layer 64 which forms a buried base contact electrode underlying the active base region 70. A conductive layer 74 and an underlying gate oxide 76 form an isolated gate electrode G overlying the active base region 70. Dielectric sidewall spacers 78 are formed on the sidewalls of the conductive layer 74. Lightly doped regions 80 of an N conductivity type extend into the surface of the base region 70 adjacent the heavily doped regions 66 and 68 which form the emitter and collector. The lightly doped regions 80 underlie the dielectric sidewall spacers 78. Field isolation regions 82 are defined in the surface for formation of bipolar transistors, MOSFETs, GCLBTs or other devices, as required. Conductive terminal contacts 84, 86, 88 and 90 are provided to the emitter electrode E, the collector electrode C, the base electrode B and the gate electrode G, respectively, for operation as a GCLBT.

Thus, it can be seen that the GCLBT may be viewed as a lateral bipolar transistor having an emitter electrode E, a base electrode B and a collector electrode C, plus a fourth gate electrode G. Application of a signal to the gate electrode G influences the path of the collector current through the base region, and thereby has a significant effect on the operation of the GCLBT. Alternatively, the GCLBT may be seen as a MOSFET having source and drain regions provided by the heavily doped emitter and collector regions 66 and 68, a MOS channel through the surface of the active base region 70 extending therebetween, and an additional buried. The lightly doped regions 80 resemble the LDD regions formed in advanced MOS transistors and thus, reduce the effective channel length of the surface MOS channel. However, these lightly doped regions 80 also influence the operation of the GCLBT as a bipolar transistor, reducing the effective base width of the lateral bipolar transistor. Furthermore, the surface of a region 92 under the gate is selectively implanted to control the threshold voltage of the surface MOS channel under the gate. Since the gate voltage influences the collector current path, the threshold adjust implant also influences the bipolar transistor characteristics. Thus, a GCLBT structure is provided which includes features similar to those of an advance MOSFET structure using LDD technology, to improve its operation, particularly for analog applications.

The key difference between the GCLBT shown in FIG. 4 and a conventional known lateral PNP transistor is the presence of the gate electrode G. A voltage is applied to the gate electrode G formed above the active base region 70. The electrode G spans the active base region 70 between the emitter and collector regions 66 and 68, and provides for control of the collector current path through the active base region 70.

Figure 5:
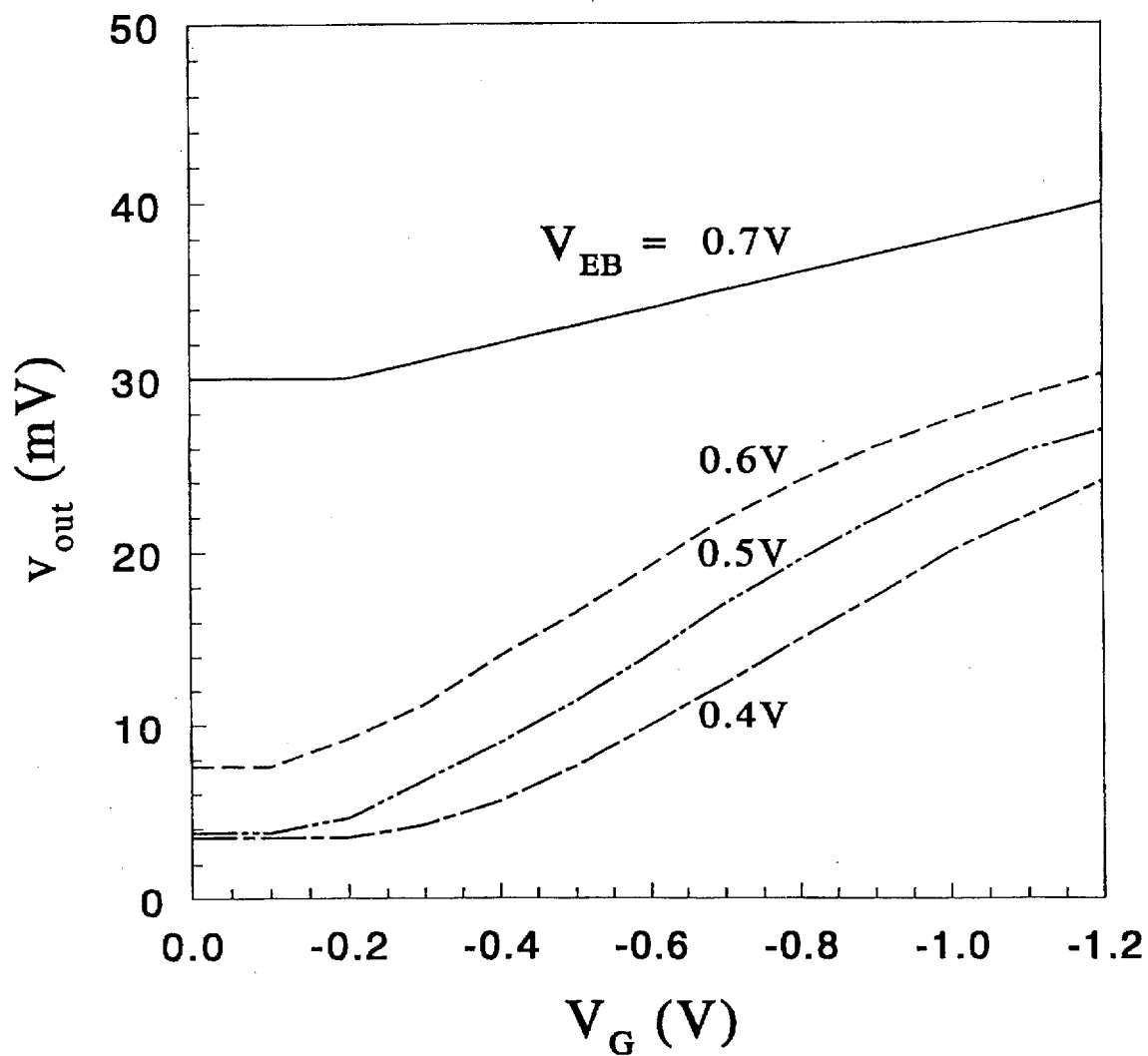
FIG. 5 illustrates gain control voltage - output voltage characteristics of the gain-controlled amplifier at a fixed input signal frequency and varied input bias voltages.

FIG. 5 shows measured characteristics of gain control voltage $V_G$—output voltage $v_{out}$ of the gain-controlled amplifier in which the frequency f of the input signal to be amplified is fixed at 115 MHz. The voltage $vi_n$ of the input signal is 160 mV. Examples of the bias voltage $V_{EB}$ are 0.4V, 0.5V, 0.6V and 0.7V. The gain control voltage $V_G$ is varied from 0 to −1.2V.

Figure 6:
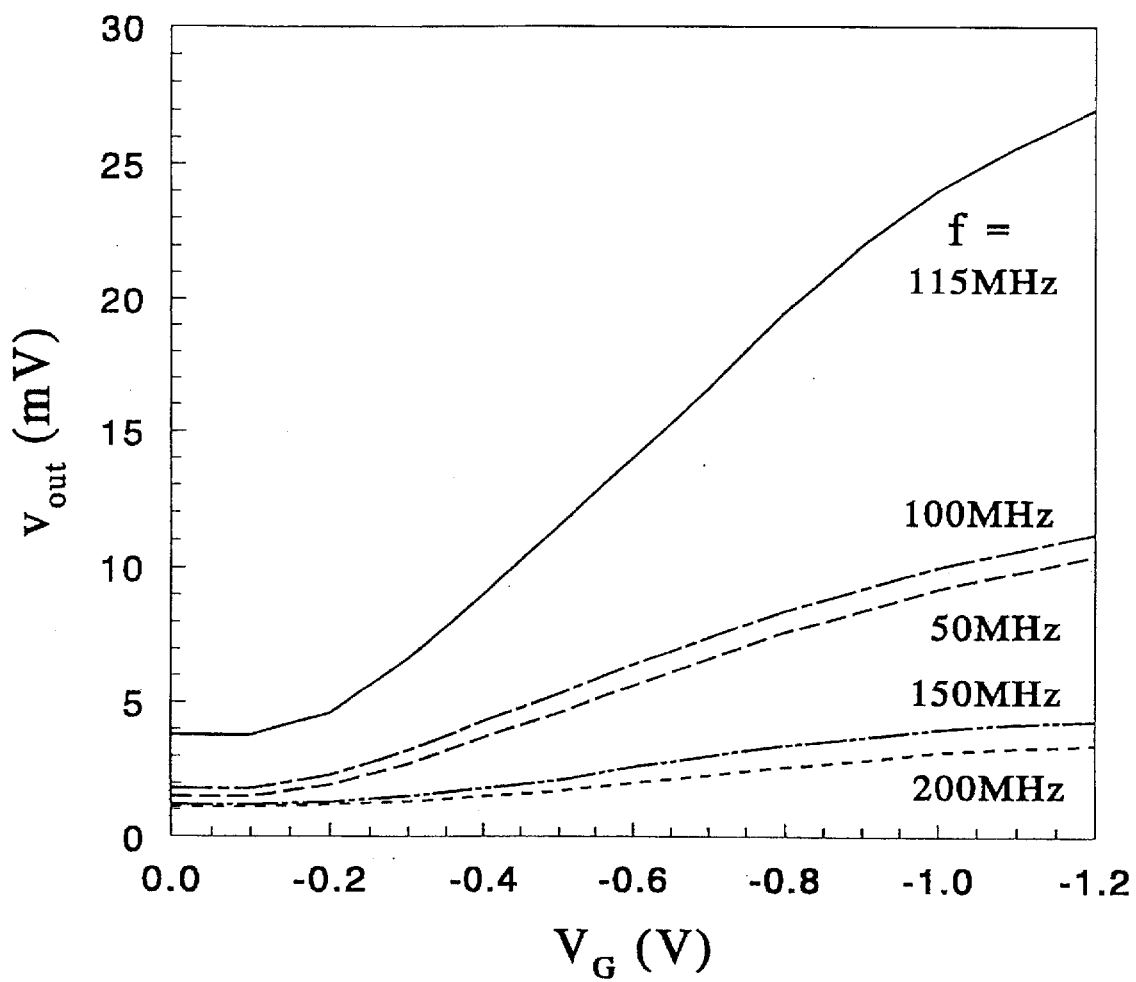
FIG. 6 illustrates gain control voltage - output voltage characteristics of the gain-controlled amplifier at a fixed input bias voltage and varied input frequencies.

FIG. 6 also shows measured characteristics of gain control voltage $V_G$ - output voltage $v_{out}$ of the gain-controlled amplifier in which the bias voltage $V_{EB}$ is fixed at 0.5V. The voltage $vi_n$ of the input signal is 160 mV constant. Examples of the frequency F of the input signal are 50, 100, 115, 150 and 200 MHz. The gain control voltage $V_G$ is varied from 0 to −1.2V.

As seen from FIGS. 5 and 6, the gain control voltage $V_G$ - output voltage $v_{out}$ characteristics are linear from −0.2V to −1.2V. The optimal gain control performance in this configuration can be obtained for the bias voltage $V_{EB}$ of 0.4 to 0.6V and a frequency of 115 MHz. Obviously, due to a very large parasitic capacitance at both input and output circuits of the GCLBT 42 under test, the AC gain and bandwidth are quite low, that is also the reason why large input signal voltage $vi_n$ of 160 mV is chosen in order to obtain measurable output signals for the gain-controlled amplifier. Also, due to a higher measuring frequency of 50 MHz to 200 MHz, the gain is low. These measured results suggest that the gain could be improved significantly by reducing the frequency range, reducing the load capacitance, and increasing the load resistance.

The simulation results below show much better gain control characteristics for this test circuit, which is strongly related to the load capacitance value. Therefore, the gain-controlled amplifier using this GCLBT can be further improved if this test gain-controlled amplifier can be integrated together with an output buffer, or by adding a gain stage in between the amplifier and the output buffer.

III. Simulation Results Simulation has been made regarding a gain-controlled amplifier shown in FIG. 3 in two cases: (i) without a Bias-T 46 and (ii) with a Bias-T 46 having series-connected inductor 48 and capacitor 50 at the emitter electrode E of the GCLBT 42. FIGS. 7–11 show simulation results of case (i) and FIGS. 12–16 show simulation results of case (ii).

Figure 7:
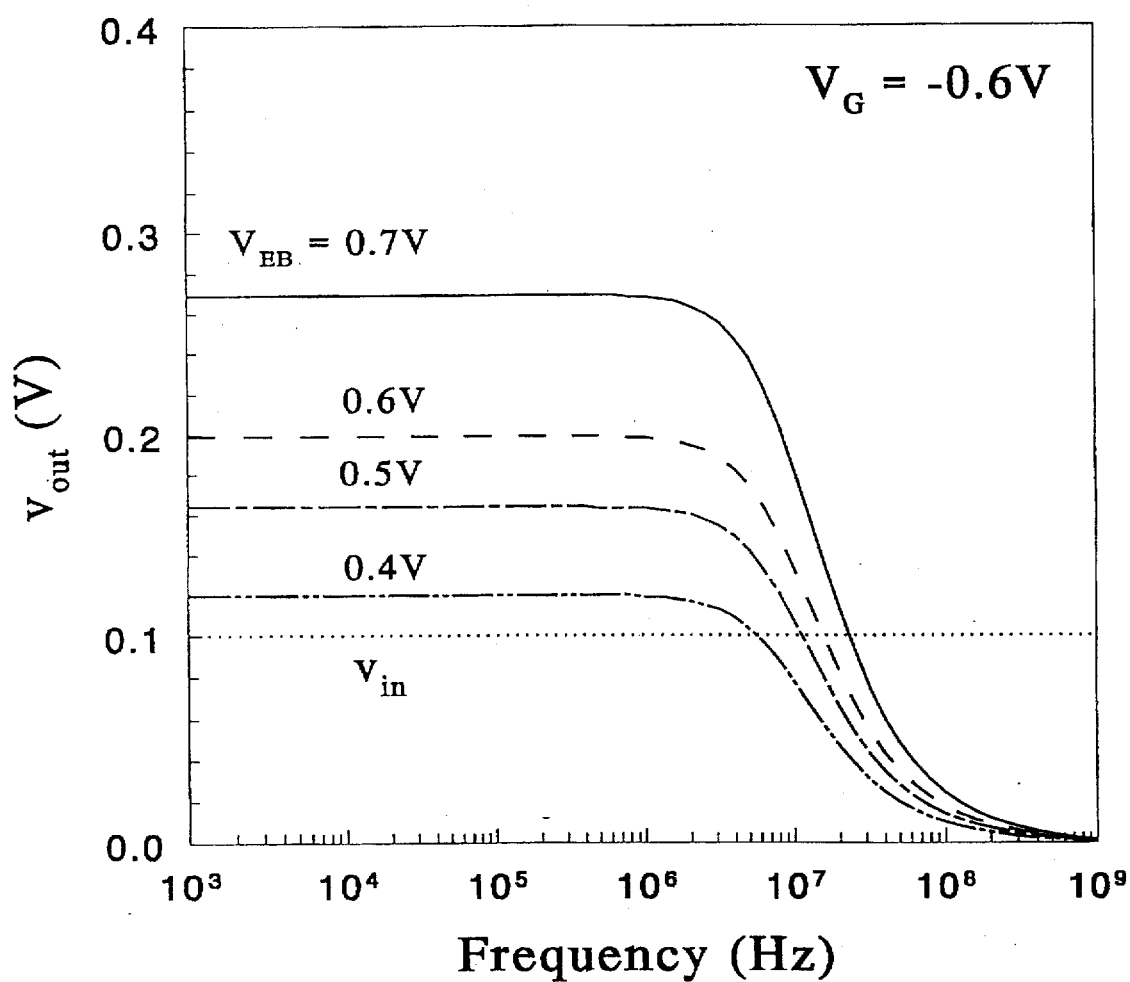
FIG. 7 illustrates simulated input signal frequency - output voltage characteristics of the gain-controlled amplifier without a Bias-T at varied input bias voltages.
Figure 8:
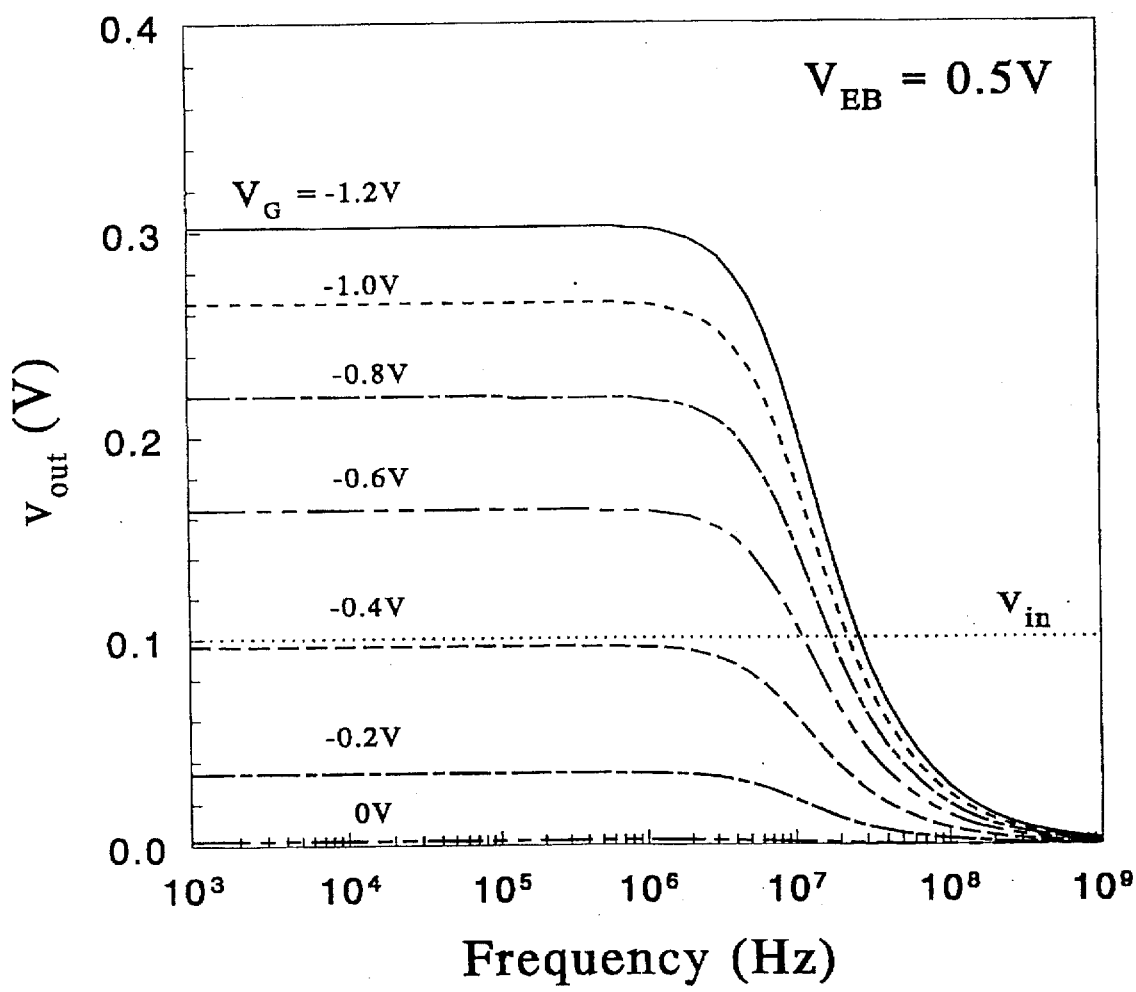
FIG. 8 illustrates simulated input signal frequency - output voltage characteristics of the gain-controlled amplifier without a Bias-T at varied gain control voltages.
Figure 9:
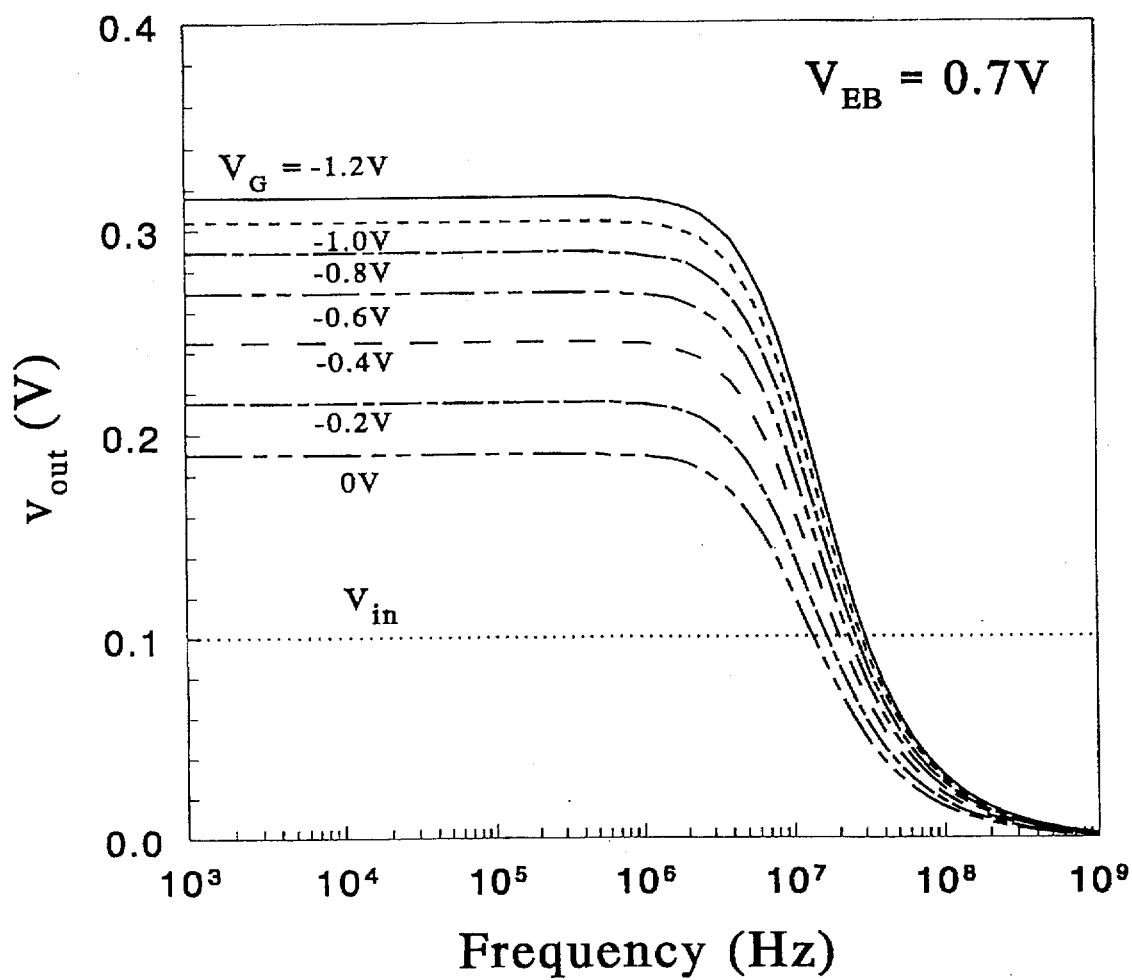
FIG. 9 illustrates another simulated input signal frequency - output voltage characteristics of the gain-controlled amplifier without a Bias-T at varied gain control voltages.
Figure 12:
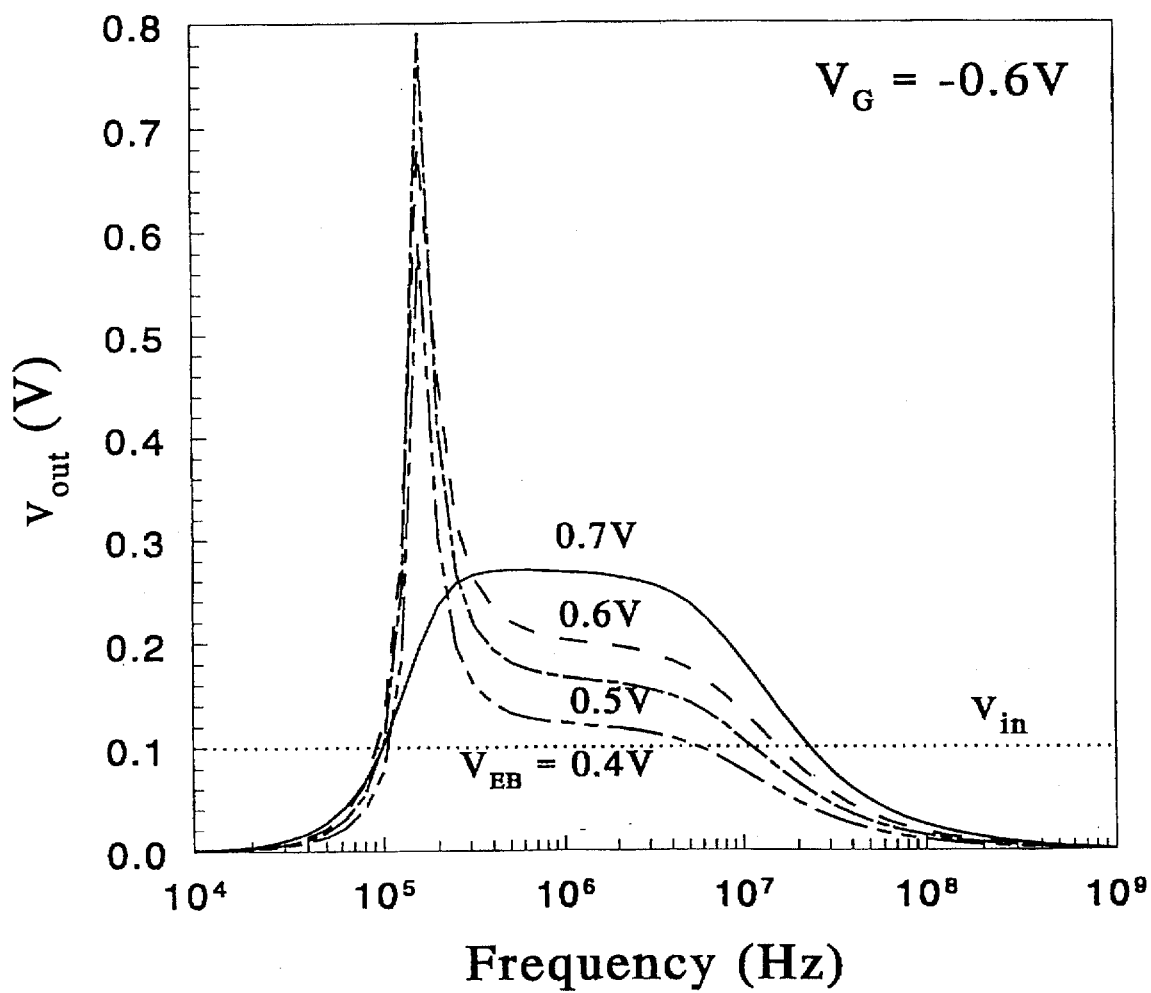
FIG. 12 illustrates simulated input signal frequency - output voltage characteristics of the gain-controlled amplifier with a Bias-T at varied input bias voltages.
Figure 13:
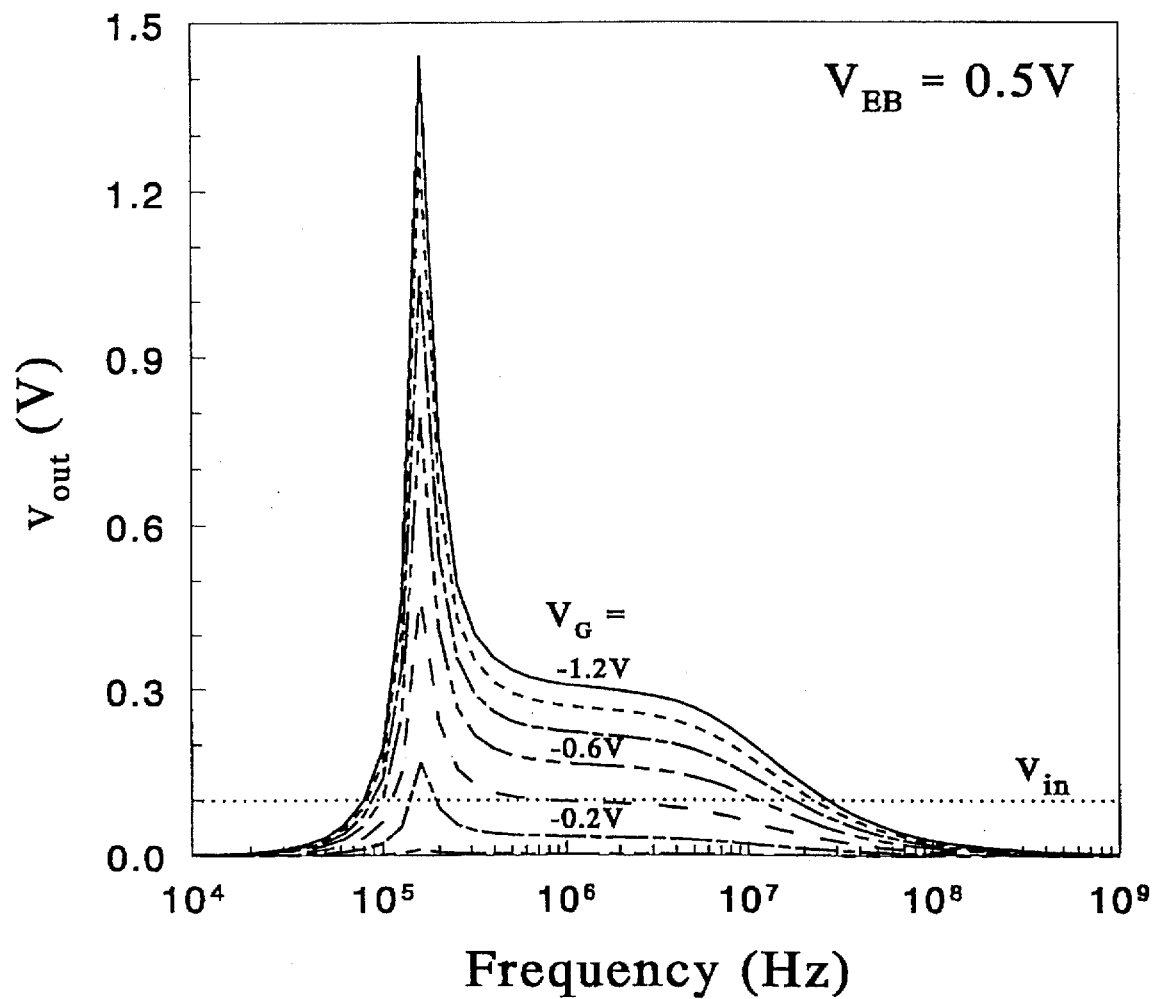
FIG. 13 illustrates simulated input signal frequency - output voltage characteristics of the gain-controlled amplifier with a Bias-T at varied gain control voltages.
Figure 14:
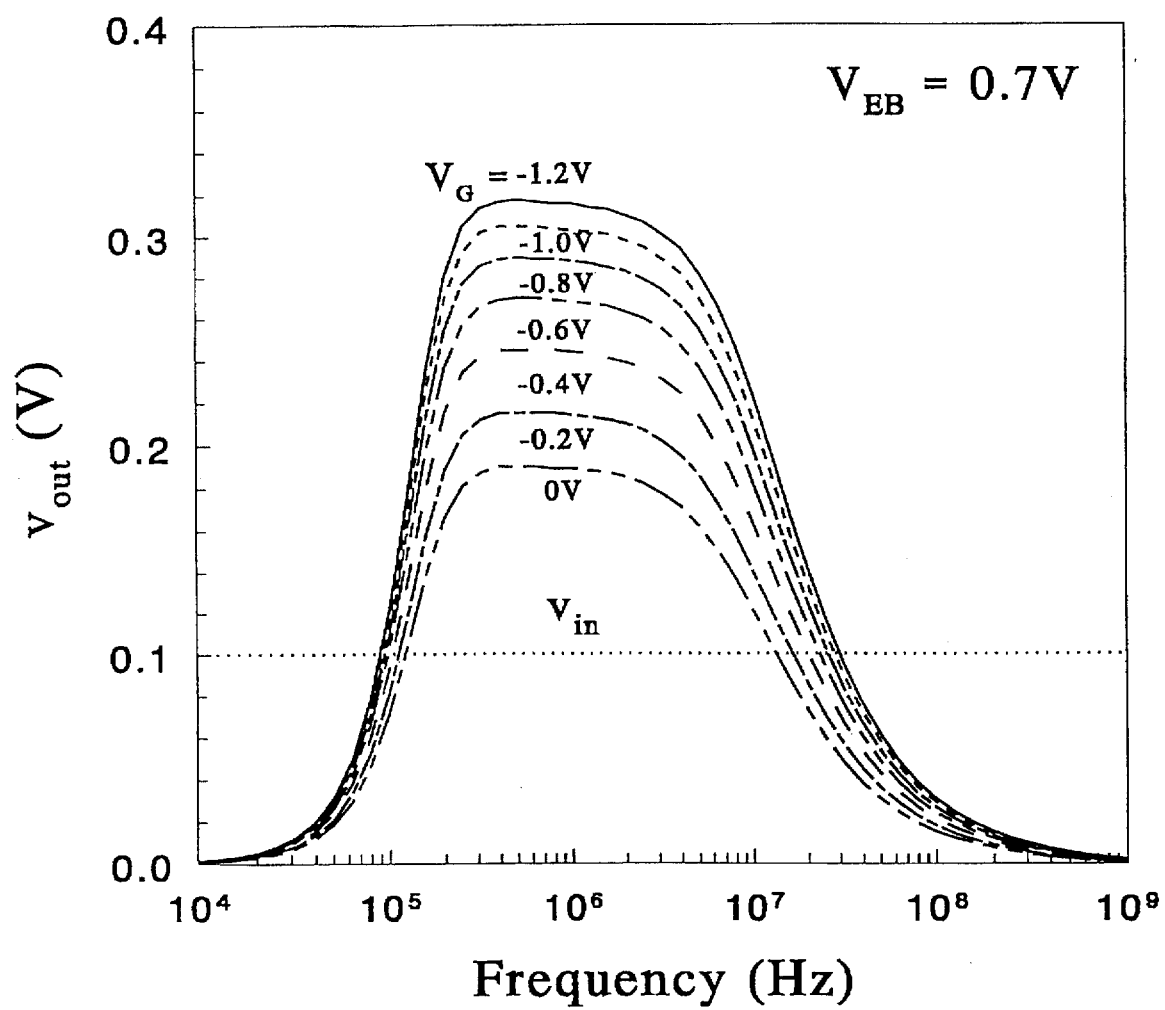
FIG. 14 illustrates another simulated input signal frequency - output voltage characteristics of the gain-controlled amplifier with a Bias-T at varied gate control voltages.

FIGS. 7 and 12 show gain control frequency response for different bias voltage $V_{EB}$ in amplifiers without and with a Bias-T, respectively. In both amplifiers, the gain control voltage $V_G$ is fixed at −0.6V and the input signal voltage $vi_n$ is 100 mV. The output signal voltage $v_{out}$ and the frequency response increase as the bias voltage $V_{EB}$ is increased in the range of 0.4 to 0.7V.

FIGS. 8, 9 and 13, 14 show gain control frequency response for different gain control voltage $V_G$ in amplifiers without and with a Bias-T, respectively. In the amplifiers, the gain control voltage $V_G$ is varied from 0 to −1.2V. The fixed input signal voltage $vi_n$ is 100 mV and the bias voltage $V_{EB}$ is 0.5V and 0.7V, respectively. Clearly, the gain control range for $V_{EB}$=0.5V is much larger than for $V_{EB}$=0.7V, which is consistent with the measured results.

Figure 10:
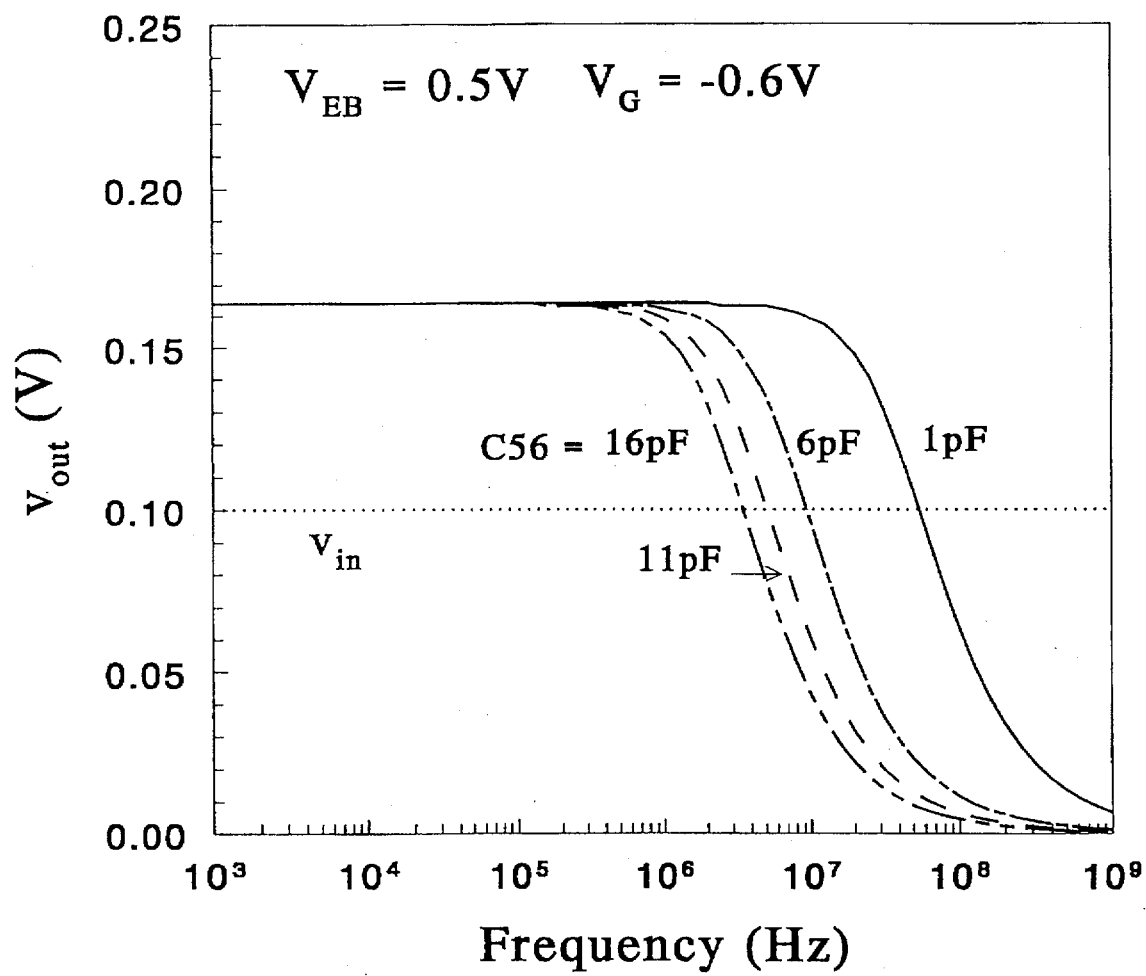
FIG. 10 illustrates simulated input signal frequency - output voltage characteristics of the gain-controlled amplifier without a Bias-T at varied load capacitances.
Figure 15:
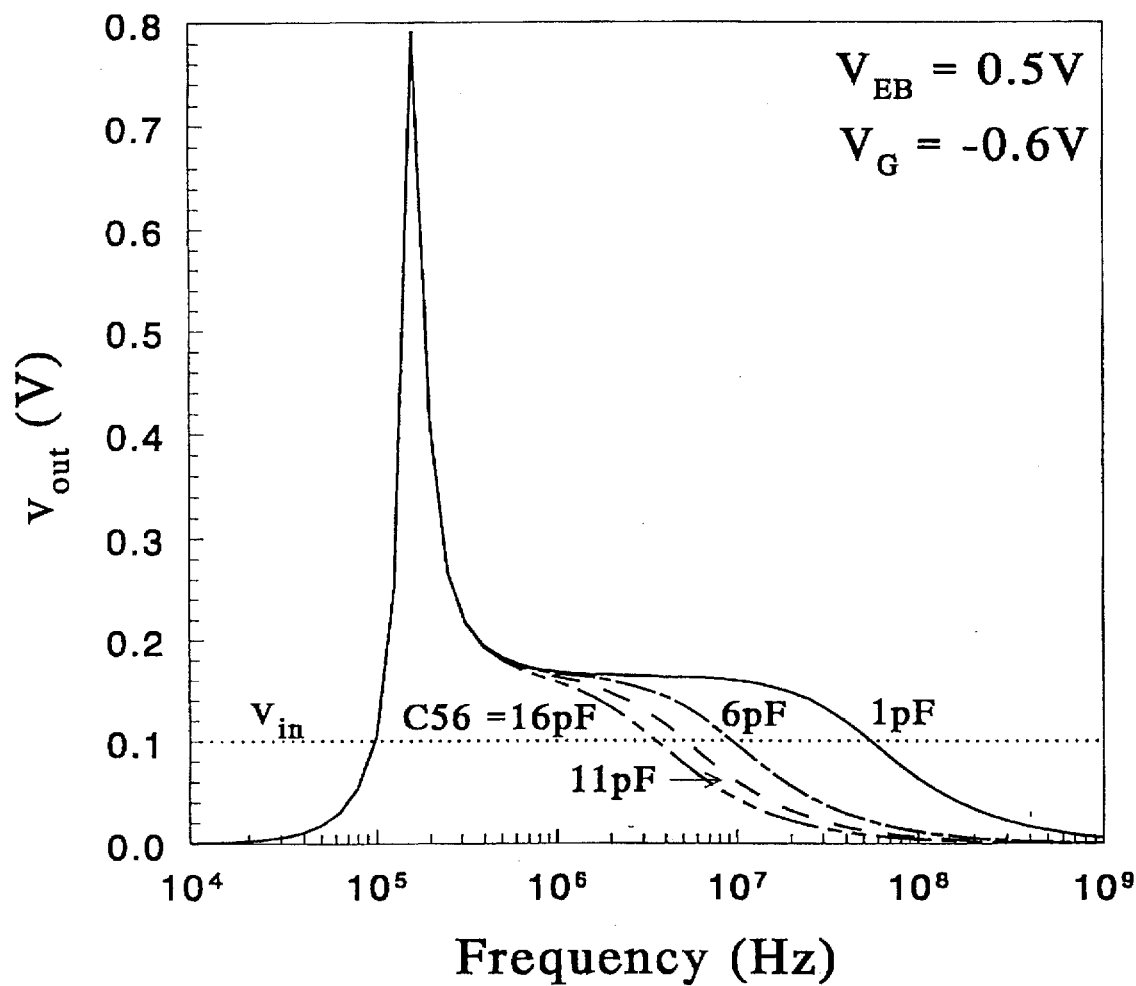
FIG. 15 illustrates simulated input signal frequency - output voltage characteristics of the gain-controlled amplifier with a Bias-T at varied load capacitances.

FIGS. 10 and 15 show gain control frequency responses for different load capacitance C56 from 1 pF to 16 pF. The simulation results show that the lower value of the load capacitance C56 has much better frequency response.

Figure 11:
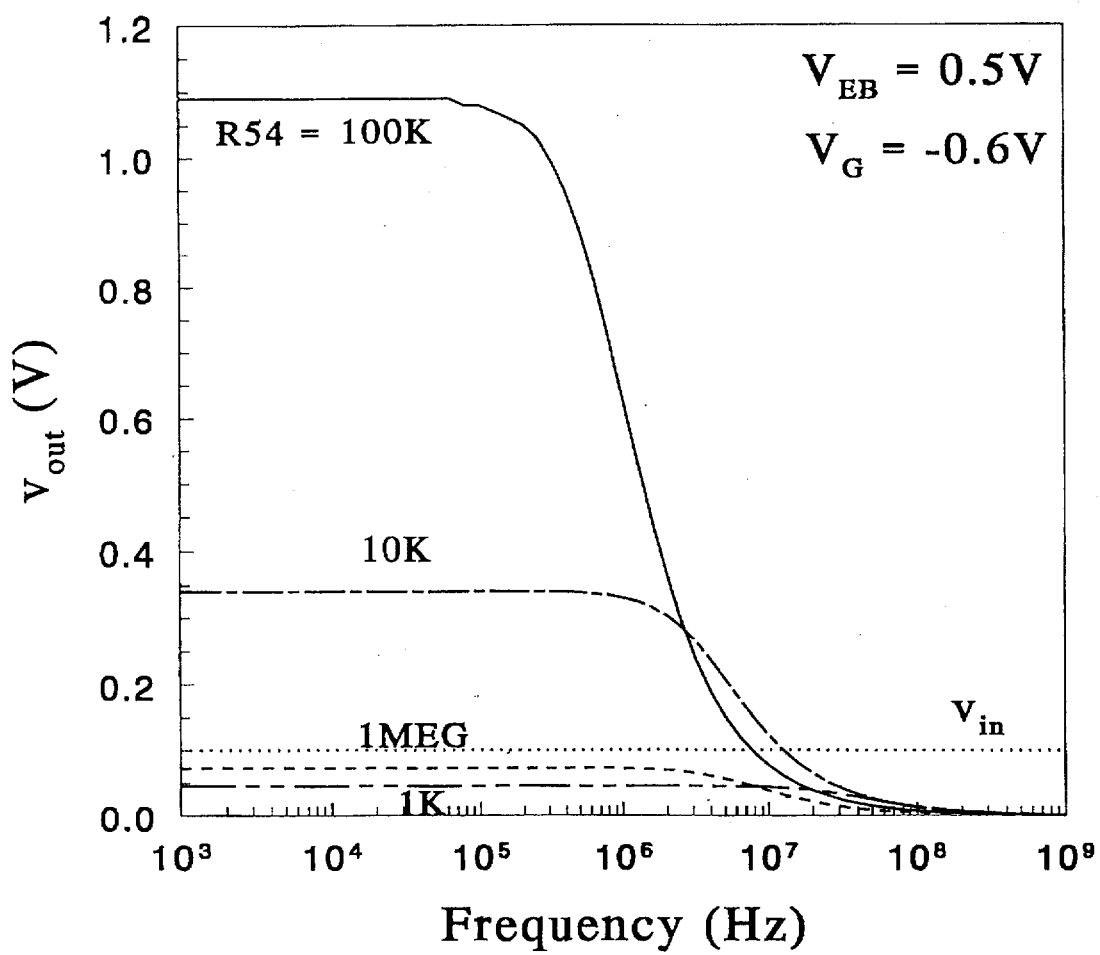
FIG. 11 illustrates simulated input signal frequency - output voltage characteristics of the gain-controlled amplifier without a Bias-T at varied load resistances.
Figure 16:
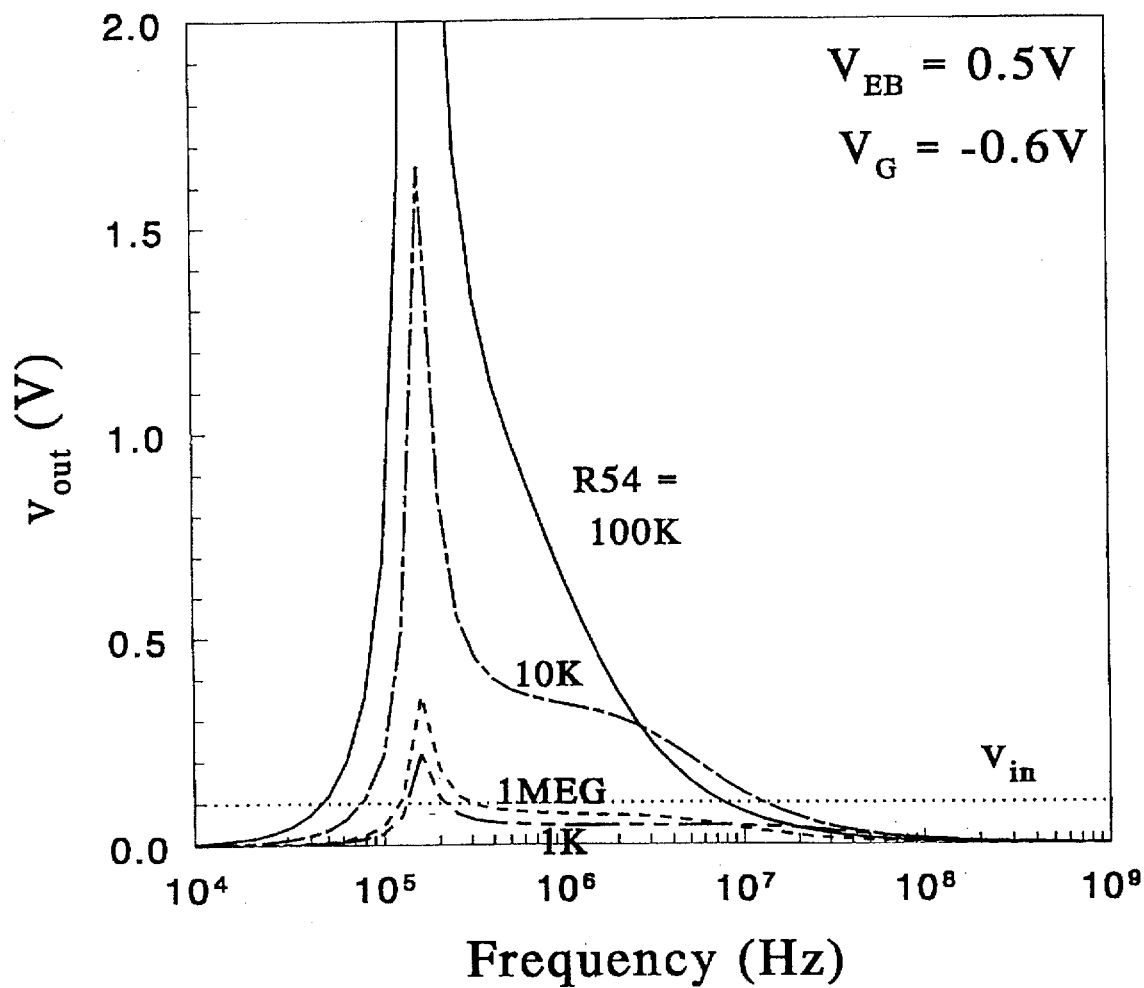
FIG. 16 illustrate simulated input signal frequency - output voltage characteristics of the gain-controlled amplifier with a Bias-T at varied load resistances.

FIGS. 11 and 16 show gain control frequency responses for different load resistance R54 of 1 kΩ to 1MΩ. The gain increases and the bandwidth decreases correspondingly as the load resistance R54 increases from 1 kΩ to 100 kΩ, but significantly decreases for 1MΩ, because the device is now in the saturation mode of operation.

The frequency response less than 200 kHz depends upon the inductance L48 and the capacitance C50 and the higher frequency response is the same as in the first simulation without the Bias-T 46. The peak response at the lower frequency may be dampened by increasing the inductance L48 and the capacitance C50.

The gain-controlled amplifier shown in FIG. 3 is much simpler than the conventional bipolar gain control amplifiers as illustrated in FIGS. 1 and 2. The frequency response (or the bandwidth) is high due to the common base configuration, as compared with the common emitter configuration because there is no Miller effect caused by the base-collector parasitic capacitance of the transistor.

The gain-controlled amplifier shown in FIG. 3 utilizing the GCLBT shown in FIG. 4 is easily integrated with other required signal processing circuits using advanced CMOS and/or bipolar technologies. As expected from the common base configuration, the gain is low. To increase the gain, another stage is readily added to the circuit. The gain-controlled amplifier can be used for an automatic gain control amplifier and also may be used for radio frequency and intermediate frequency amplifiers.

IV. Embodiment Automatic Gain Control Amplifier

Figure 17:
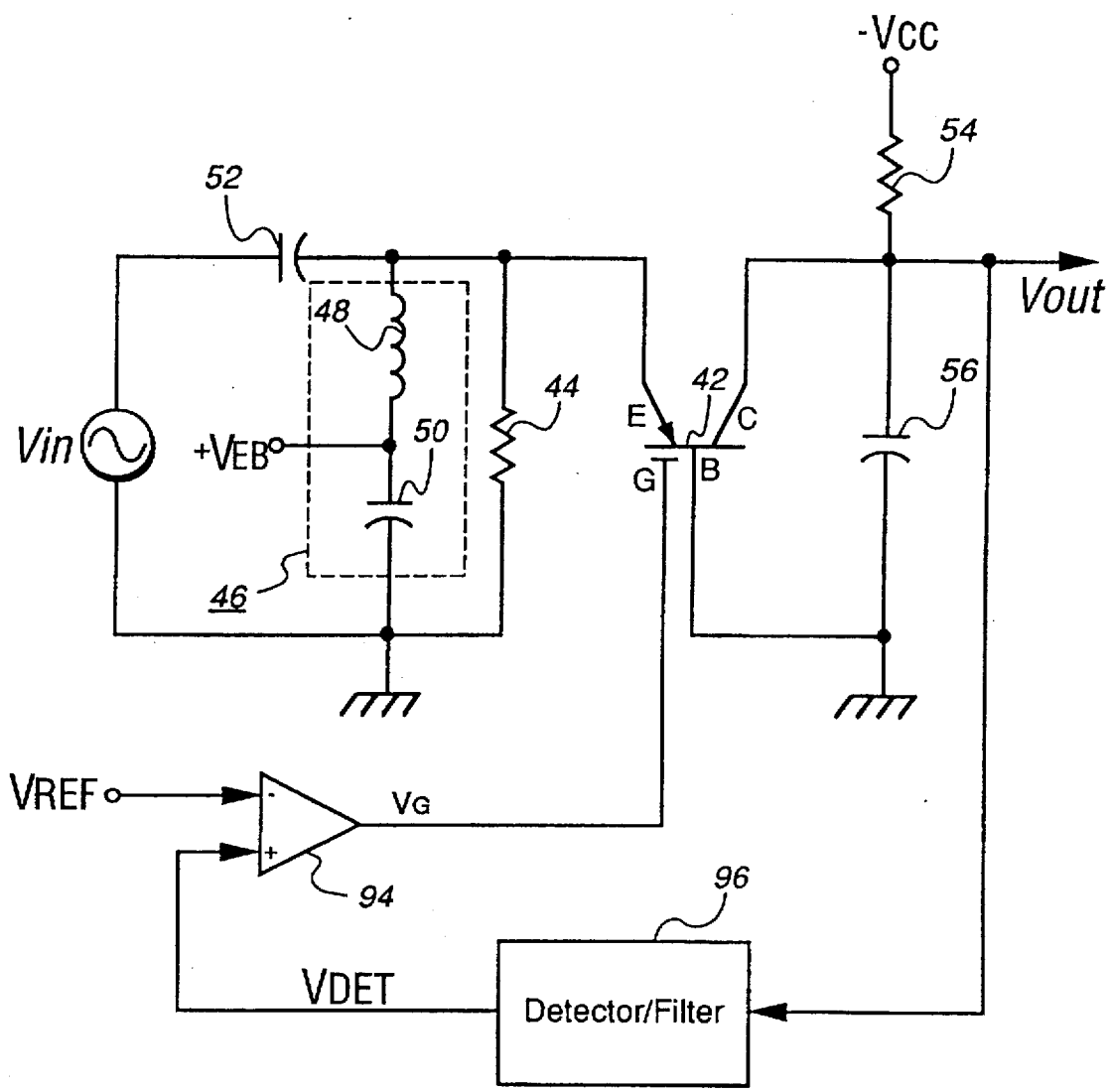
FIG. 17 is a circuit diagram of an automatic gain control amplifier utilizing the gain-controlled amplifier.

FIG. 17 shows an automatic gain control (AGC) amplifier using the gain-controlled amplifier shown in FIG. 3. As shown in FIG. 17, an AGC amplifier is of delayed AGC and includes a voltage control amplifier 94 and a detector/filter 96 in a negative feedback loop. The detector/filter 96 receives the amplified output signal of voltage $v_{out}$ from the variable gain control amplifier and provides a detected voltage $V_{DET}$ to the non-inverting terminal of the voltage control amplifier 94. A reference voltage $V_{REF}$ is fed to the inverting terminal of the voltage control amplifier 94 by a voltage source (not shown). The voltage control amplifier 94 compares the detected voltage $V_{DET}$ to the reference voltage $V_{REF}$ and provides the gain control voltage $V_G$ to the gate electrode G of the GCLBT 42. When the detected voltage $V_{DET}$ is smaller than the reference voltage $V_{REF}$, the voltage control amplifier 94 provides a constant gain control voltage $V_G$ and therefore, the gain of the variable gain control amplifier is constant. In a case where the detected voltage $V_{DET}$ goes beyond the reference voltage $V_{REF}$, however, the voltage control amplifier 94 lessens the gain control voltage $V_G$ dependent upon the detected voltage $V_{DET}$ and therefore, the gain of the variable gain control amplifier is variably lessened.

The AGC negative feedback loop may include an amplifier to increase a control sensitivity. The detector may include an average or a peak detector.

Although particular embodiments of the present invention have been described in detail, it should be appreciated that numerous variations, modifications, and adaptations may be made without departing from the scope of the present invention as defined in the claims.

What is claimed is:

1. A gain-controlled amplifier comprising a gate controlled lateral bipolar transistor (GCLBT) having emitter, collector, base and gate electrodes, the GCLBT being provided in a common base configuration, the gain-controlled amplifier further comprising:
   means for providing a first voltage to the base electrode;
   means for providing a second voltage to the collector electrode via a load circuit having a frequency response control element;
   means for applying an input signal to the emitter electrode; and
   means for providing a gain control voltage to the gate electrode, thereby providing an amplified signal of the input signal from the collector electrode in response to the gain control voltage.

2. The gain-controlled amplifier of claim 1, wherein the load circuit including a resistance element which is connected between the collector electrode of the GCLBT and a terminal to which the second voltage is provided.

3. The gain-controlled amplifier of claim 1, wherein the load circuit including a capacitance element which is connected between the collector and the base electrodes of the GCLBT.

4. The gain-controlled amplifier of claim 1, further comprising an input dc bias network having an inductance element and a capacitance element, the network being connected to the emitter electrode of the GCLBT, the inductance and capacitance being selected to provide an adequate low frequency response of the gain-controlled amplifier.

5. The gain-controlled amplifier of claim 4, wherein the inductance element and the capacitance element are connected in series between the emitter electrode of the GCLBT and a terminal to which the first voltage is provided, the junction of the inductance element and the capacitance element being connected to a terminal to which a dc bias voltage is provided.

6. The gain-controlled amplifier of claim 1, wherein the GCLBT is a PNP type transistor.

7. The gain-controlled amplifier of claim 1, wherein the first and second voltages are zero volts and a negative voltage, respectively.

8. The gain-controlled amplifier of claim 5, wherein the terminal to which the first voltage is provided is the ground terminal and the dc bias voltage is a positive voltage.

9. An automatic gain control amplifier for an integrated circuit, comprising a gate controlled lateral bipolar transistor (GCLBT) having emitter, collector, base and gate electrodes, the GCLBT being provided in a common base configuration, the automatic gain control amplifier further comprising:
   means for providing a first voltage to the base electrode;
   means for providing a second voltage to the collector electrode via a load circuit having a frequency response control element;
   means for applying an input signal to the emitter electrode, thereby providing an output signal from the collector electrode in response to the input signal; and
   gain control means for providing a gain control voltage to the gate electrode in response to the output signal from the collector electrode, whereby the input signal is amplified in response to the gain control voltage so as to provide an amplified output signal from the collector electrode of the GCLBT.

10. The automatic gain control amplifier of claim 9, wherein the gain control means comprises means for comparing the amplified output signal voltage to a reference voltage and for providing a constant gain control voltage when the amplified output signal voltage is smaller than the reference voltage and providing a variable gain control voltage when the amplified output signal voltage is larger than the reference voltage so as to lessen the gain of the amplifier in response to the amplified output signal voltage.

11. The automatic gain control amplifier of claim 9, further comprising an input network having an inductance element and a capacitor element, the network being connected to the emitter electrode of the GCLBT, the inductance and capacitance being selected to control the frequency response of the automatic gain control amplifier.

12. The automatic gain control amplifier of claim 8, wherein the GCLBT is a PNP type transistor.

* * * * *